(12) United States Patent
Inoue et al.

(10) Patent No.: US 8,959,001 B2
(45) Date of Patent: Feb. 17, 2015

(54) TEST PATTERN GENERATION FOR SEMICONDUCTOR INTEGRATED CIRCUIT

(75) Inventors: Michiko Inoue, Nara (JP); Tomokazu Yoneda, Nara (JP); Yasuo Sato, Fukuoka (JP)

(73) Assignees: National University Corporation Nara Institute of Science and Technology, Nara (JP); Kyushu Institute of Technology, Fukuoka (JP)

( * ) Notice: Subject to any disclaimer, the term of this patent is extended or adjusted under 35 U.S.C. 154(b) by 253 days.

(21) Appl. No.: 13/550,008

(22) Filed: Jul. 16, 2012

(65) Prior Publication Data

US 2012/0283981 A1    Nov. 8, 2012

Related U.S. Application Data

(63) Continuation of application No. PCT/JP2011/000059, filed on Jan. 7, 2011.

(30) Foreign Application Priority Data

Jan. 15, 2010  (JP) .................................. 2010-007003

(51) Int. Cl.
*G01R 31/26*     (2014.01)
*G01R 31/3183*   (2006.01)
(Continued)

(52) U.S. Cl.
CPC  *G01R 31/318371* (2013.01); *G01R 31/318544* (2013.01); *G01R 31/318385* (2013.01); *G01R 31/31721* (2013.01)
USPC ........... 702/120; 714/732; 714/726; 714/729; 714/742

(58) Field of Classification Search
CPC ................ G01R 31/318371; G01R 31/31721; G01R 31/318385; G01R 31/318544
USPC .................. 702/120; 714/732, 726, 729, 742; 324/763, 765
See application file for complete search history.

(56) References Cited

U.S. PATENT DOCUMENTS 4,942,556 A * 7/1990 Sasaki et al. ................... 365/200
5,392,298 A * 2/1995 Shinjo ............................ 714/736

(Continued)

FOREIGN PATENT DOCUMENTS

| JP | 09-146999 | 6/1997 |
| JP | 2003-085233 | 3/2003 |
| JP | 2008-224315 A | 9/2008 |

OTHER PUBLICATIONS

Tomokazu Yoneda et al., "Thermal-Uniformity-Aware X-Filling to Reduce Temperature-Induced Delay Variation for Accurate At-Speed Testing"; 2010 28th IEEE VLSI Test Symposium, Apr. 19, 2010, pp. 188-193.

(Continued)

*Primary Examiner* — Carol S Tsai
(74) *Attorney, Agent, or Firm* — Studebaker & Brackett PC

(57) ABSTRACT

A test pattern is sequentially selected from an original test pattern sequence constituted by a plurality of test patterns including a don't care bit. Power consumption in each of regions obtained by substantially equally dividing a layout region of a semiconductor integrated circuit in a case where a don't care value is specified in the selected test pattern and this selected test pattern is applied to the semiconductor integrated circuit is estimated. A searching is conducted for a don't care value of the selected test pattern which minimizes a variation in power consumption among the regions by repeatedly changing the don't care value and repeatedly estimating power consumption in the regions. A new test pattern sequence constituted by a plurality of test patterns including no don't care bit is generated by defining the don't care value obtained by the searching as a don't care value of the selected test pattern.

8 Claims, 5 Drawing Sheets

(51) Int. Cl.
*G01R 31/3185* (2006.01)
*G01R 31/317* (2006.01)

(56) References Cited

U.S. PATENT DOCUMENTS

| | | | |
|---|---|---|---|
| 5,719,881 A * | 2/1998 | Yonetoku | 714/25 |
| 6,338,032 B1 * | 1/2002 | Chen | 703/16 |
| 6,415,408 B1 * | 7/2002 | Rhodes et al. | 714/738 |
| 6,477,676 B1 * | 11/2002 | Rhodes et al. | 714/743 |
| 6,571,365 B1 * | 5/2003 | Rhodes et al. | 714/738 |
| 6,629,276 B1 * | 9/2003 | Hoffman et al. | 714/726 |
| 7,231,570 B2 * | 6/2007 | Wang et al. | 714/729 |
| 7,412,637 B2 * | 8/2008 | Wang et al. | 714/729 |
| 7,552,373 B2 * | 6/2009 | Wang et al. | 714/729 |
| 7,590,905 B2 * | 9/2009 | Abdel-Hafez et al. | 714/726 |
| 7,721,172 B2 * | 5/2010 | Wang et al. | 714/729 |
| 7,721,173 B2 * | 5/2010 | Wang et al. | 714/729 |
| 7,779,320 B2 * | 8/2010 | Chmelar | 714/726 |
| 7,925,465 B2 * | 4/2011 | Lin et al. | 702/124 |
| 7,945,833 B1 * | 5/2011 | Wang et al. | 714/729 |
| 8,001,437 B2 * | 8/2011 | Wen et al. | 714/738 |
| 8,290,738 B2 * | 10/2012 | Lin et al. | 702/124 |
| 2005/0268194 A1 * | 12/2005 | Wang et al. | 714/733 |
| 2006/0064614 A1 * | 3/2006 | Abdel-Hafez et al. | 714/726 |
| 2008/0195346 A1 * | 8/2008 | Lin et al. | 702/119 |
| 2008/0222473 A1 | 9/2008 | Taku | |
| 2008/0276141 A1 * | 11/2008 | Wang et al. | 714/726 |
| 2008/0276143 A1 * | 11/2008 | Wang et al. | 714/729 |
| 2009/0235132 A1 * | 9/2009 | Wang et al. | 714/726 |
| 2010/0095179 A1 * | 4/2010 | Wen et al. | 714/738 |
| 2010/0138708 A1 * | 6/2010 | Rajski et al. | 714/729 |
| 2011/0166818 A1 * | 7/2011 | Lin et al. | 702/117 |

OTHER PUBLICATIONS

Makoto Nakao et al.; "Test Pattern Re-Ordering for Thermal-Uniformity during Test", IEICE Technical Report; Feb. 8, 2010; vol. 109, No. 416 (DC2009-66); pp. 7-12; ISSN: 0913-5685.
Sudarshan Bahukudumbi et al.; "Power Management for Wafer-Level Test During Burn-In"; 17th Asian Test Symposium, Nov. 24, 2008; pp. 231-236.
Sudarshan Bahukudumbi et al.; "Power Management Using Test-Pattern Ordering for Wafer-Level Test During Burn-In"; IEEE Transactions on Very Large Scale Integration (VLSI) Systems, Dec. 2009; No. 12; pp. 1730-1741.
International Search Report; PCT/JP2011/000059; Feb. 15, 2011.

* cited by examiner

FIG.3A
WITH THE USE OF
CONVENTIONAL TEST
PATTER SEQUENCE
FIG.3B
WITH THE USE OF TEST
PATTERN SEQUENCE
GENERATED BY TEST
PATTERN GENERATION
METHOD OF PRESENT
DISCLOSURE
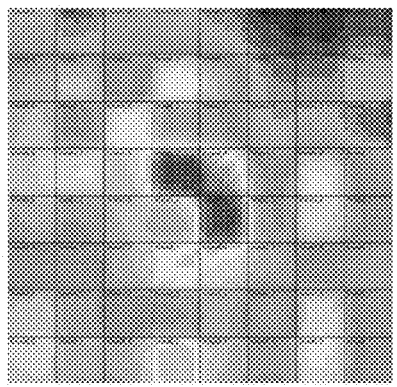
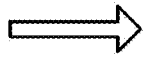
SPATIAL UNIFORMIZATION OF POWER CONSUMPTION
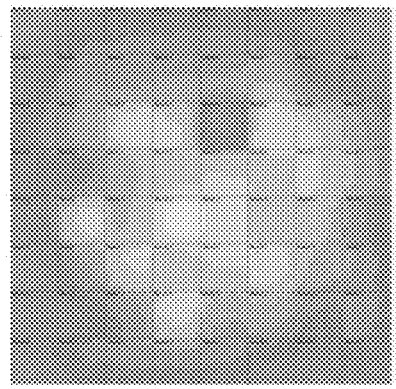

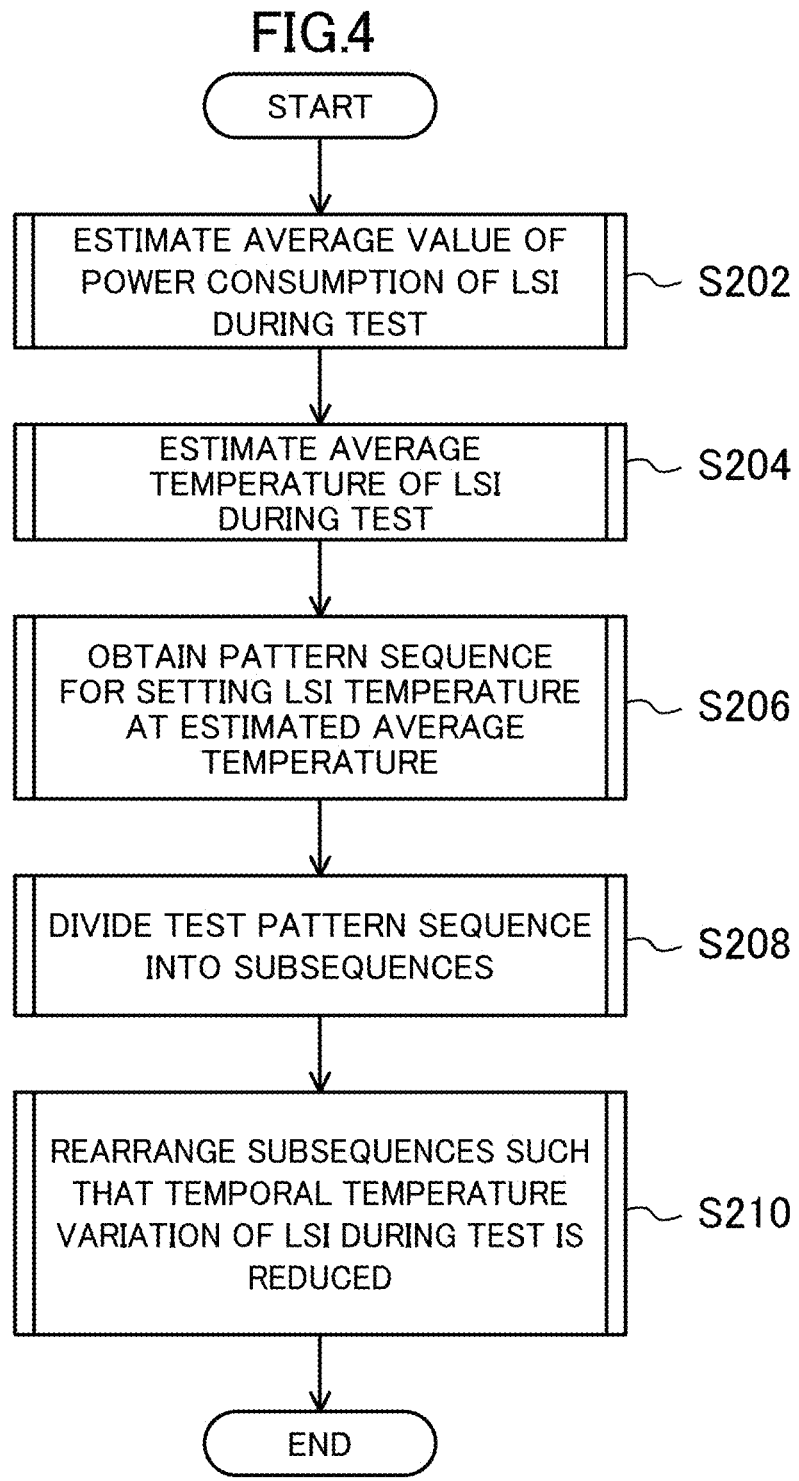

TEST PATTERN GENERATION FOR SEMICONDUCTOR INTEGRATED CIRCUIT

CROSS-REFERENCE TO RELATED APPLICATION

This is a continuation of PCT International Application PCT/JP2011/000059 filed on Jan. 7, 2011, which claims priority to Japanese Patent Application No. 2010-007003 filed on Jan. 15, 2010. The disclosures of these applications including the specifications, the drawings, and the claims are hereby incorporated by reference in their entirety.

BACKGROUND

The present disclosure relates to methods for generating test patterns for semiconductor integrated circuits, and more particularly to generation of a test pattern for use in a test on a CMOS synchronization semiconductor integrated circuit subjected to scan design.

Semiconductor integrated circuits as final products are not always non-defective, and include defective products with a stuck-at fault in which the value of a signal line is stuck at 0 or 1. In view of this, a product test for detecting a stuck-at fault needs to be conducted on all the signal lines of a semiconductor integrated circuit before shipment. In addition, with recently advanced process miniaturization, it is also necessary to detect not only a stuck-at fault but also a delay fault, i.e., to determine whether a change in value of a signal line is transmitted within a specified time or not. Thus, a test on a semiconductor integrated circuit is an important item for evaluations of performance and reliability. In some cases, a test cost occupies a half of the total cost for design and manufacturing.

Scan design is a technique for making a test on a semiconductor integrated circuit easier. A test on a semiconductor integrated circuit subjected to scan design is performed in the following manner. First, a test pattern is set in scan flip-flops by scan-in, and then is applied to a combinational circuit to capture a test response in the scan flip-flops. Scan-out of the captured test response is performed simultaneously with scan-in of the next test pattern.

A change in the value of a scan flip-flop causes changes in the values of not only transistors constituting the scan flip-flop but also transistors of a combinational circuit which receives an output of the scan flip-flop. Accordingly, a large amount of power is consumed in a semiconductor integrated circuit, thereby increasing the circuit temperature. In particular, the percentage of scan flip-flops which operate at the same time, i.e., change their values at the same time, is about 20% at most in normal operation, but rises to about 50% during a test. Accordingly, heat generation during the test is larger than that in the normal operation. Since operation speed of a CMOS transistor depends on the temperature, it is essential to control the circuit temperature during a test in order to obtain a highly accurate test result.

A test pattern sequence for a scan test can be automatically generated by an automatic test pattern generation (ATPG) tool. A test pattern sequence generated in designing a semiconductor integrated circuit is used for, for example, a manufacturing test before shipment or a field test after shipment. In general, a test pattern sequence generated by an ATPG tool includes a don't care bit, and power consumption of a semiconductor integrated circuit during a test, and eventually the temperature thereof, greatly change depending on the way of determining a don't care value and the order of applying test patterns. There is a known test pattern generation method for a low power consumption test for reducing peak power consumption and average power consumption of a semiconductor integrated circuit during the test and a low heat generation test for reducing heat generation of the semiconductor integrated circuit during the test. There is also a known test pattern generation method for a power consumption uniformizing test for reducing a change in power consumption of a semiconductor integrated circuit during the test (see, for example, Sudarshan Bahukudumbi, Krishnendu Chakrabarty, "Power Management for Wafer-Level Test During Burn-In," ats, pp. 231-236, 2008 17th Asian Test Symposium, 2008).

A semiconductor integrated circuit to which a test pattern is applied is not uniformly activated in its entire region, but is divided into one or more regions, each of which is activated to be at a high temperature, and one or more regions, each of which is not activated. Power consumption in the activated regions varies according to an applied test pattern. With further systematization and increase in scale of semiconductor integrated circuits in future, variation in spatial temperature of a semiconductor integrated circuit during a test is expected to be more conspicuous. This might be a serious problem for tests on semiconductor integrated circuits in progress of enhancing the speed and miniaturization.

Some known techniques were intended to control the temperature of a semiconductor integrated circuit from outside the circuit. However, this control requires an additional device, and thus, is not efficient. In addition, to uniformize the circuit temperature to enhance the test accuracy, mere uniformization of power consumption is insufficient, and spatial and temporal variations in power consumption needs to be considered.

There is also another known technique which is intended to reduce a temporal variation in power consumption of the entire circuit. However, this conventional technique does not consider a spatial variation in power consumption in the circuit and spatial and temporal variations in circuit temperature, and does not sufficiently satisfy a detailed test required for recent semiconductor integrated circuits.

Accordingly, there is a need for a test pattern generation method which can spatially and temporally uniformize the temperature of a semiconductor integrated circuit by devising a test pattern without an additional device.

SUMMARY

In one general aspect, the present disclosure describes a test pattern generation method for a semiconductor integrated circuit subjected to scan design includes: sequentially selecting, by using a computer, a test pattern from an original test pattern sequence constituted by a plurality of test patterns including a don't care bit; estimating power consumption in each of regions obtained by substantially equally dividing a layout region of the semiconductor integrated circuit in a case where a don't care value is specified in the selected test pattern and this selected test pattern is applied to the semiconductor integrated circuit; searching for a don't care value of the selected test pattern which minimizes a variation in power consumption among the regions by repeatedly changing the don't care value and repeatedly estimating power consumption in the regions; and generating a first new test pattern sequence constituted by a plurality of test patterns including no don't care bit by defining the don't care value obtained by the searching as a don't care value of the selected test pattern.

With this method, a don't care value of each of the test patterns in the original test pattern sequence is determined such that power consumption of the semiconductor integrated circuit during a test is uniform among the regions of the circuit, and a first test pattern sequence including no don't care bit is generated. Accordingly, the use of the first test pattern sequence for the test can spatially uniformize the temperature of the semiconductor integrated circuit during the test.

The test pattern generation method may further include generating a second new test pattern sequence by estimating a change in temperature of the semiconductor integrated circuit in a case where the test patterns included in the first new test pattern sequence are sequentially applied to the semiconductor integrated circuit, and by rearranging an order of applying the test patterns included in the first new test pattern sequence such that a temporal temperature variation of the semiconductor integrated circuit during a test is reduced.

In this case, the use of the second test pattern sequence for the test can temporally uniformize the temperature of the semiconductor integrated circuit during the test without a decrease of coverage.

BRIEF DESCRIPTION OF THE DRAWINGS

The figures depict one or more implementations in the present teaching, by way of example only, not by way of limitations.

FIGS. 3A and 3B illustrate thermal simulation results on a conventional test pattern sequence and a test pattern sequence according to the present disclosure, respectively;

FIG. 4 illustrates a detailed flow chart of a change of the order of applying test patterns;

DETAILED DESCRIPTION

<Spatial Temperature Uniformization>

Figure 1:
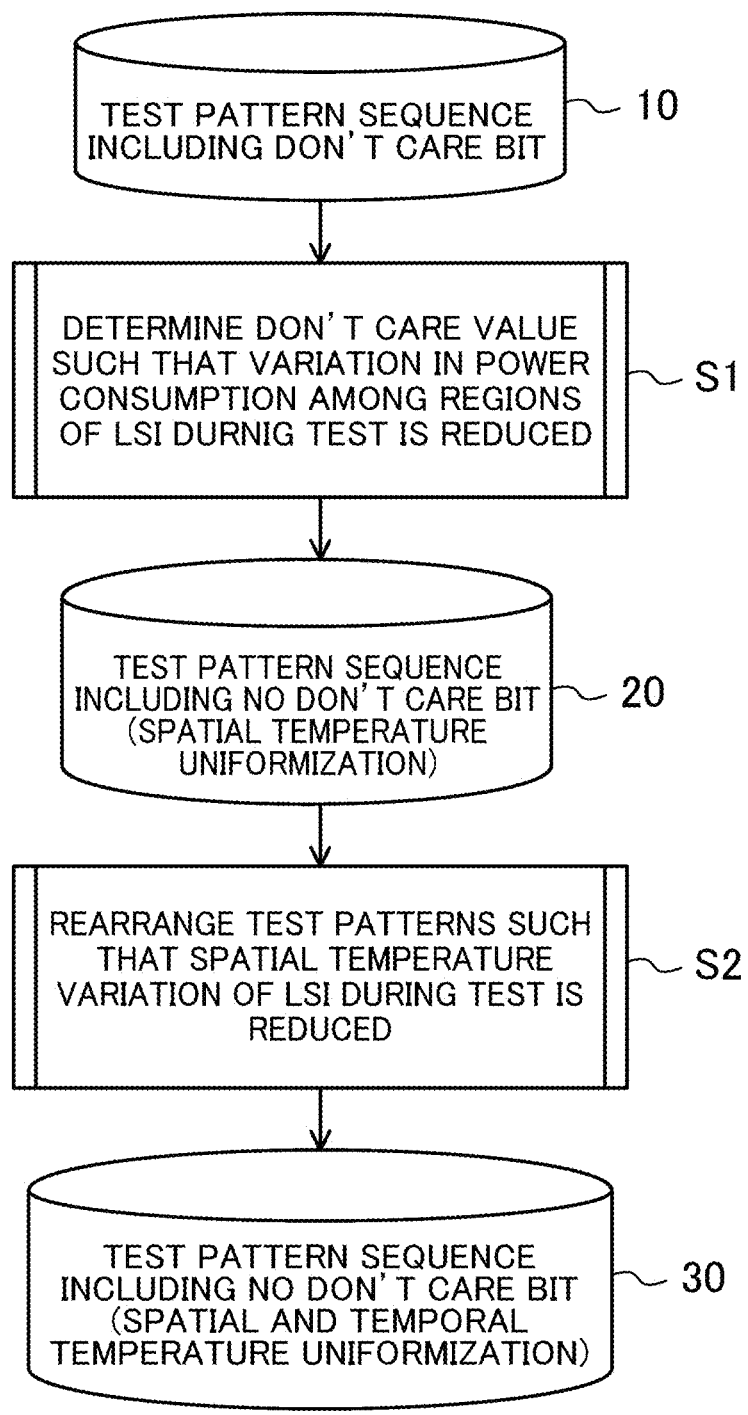
FIG. 1 illustrates a schematic flow chart of a test pattern generation method according to an embodiment of the present disclosure.

FIG. 1 illustrates a schematic flow chart of a test pattern generation method according to an embodiment of the present disclosure. This test pattern generation method can be performed by causing a program recorded on a computer-readable medium to be executed by a computer.

First, a test pattern sequence 10 constituted by a plurality of test patterns including a don't care bit is prepared. By way of example, the test pattern sequence 10 may include a test pattern including a plurality of don't care bits. The test pattern sequence 10 can be generated by using a general ATPG tool. Then, for each of the test patterns in the test pattern sequence 10, a don't care value is determined such that a variation in power consumption among regions of a semiconductor integrated circuit during the test is reduced. Thereafter, a test pattern sequence 20 of a plurality of test patterns including no don't care bit is generated (S1). Specifically, a don't care value of each test pattern is determined such that power consumption of the semiconductor integrated circuit during the test is spatially uniform, with respect to the test pattern sequence 10 constituted by a plurality of test patterns including a given don't care bit. Then, the test pattern sequence 20 constituted by a plurality of test patterns including no don't care bit is generated.

The regions of the semiconductor integrated circuit refer to regions obtained by equally or substantially equally dividing a layout region of the semiconductor integrated circuit. For example, the layout region of the semiconductor integrated circuit is divided into 64 regions of 8×8 in rows and columns. This division is employed to estimate a spatial variation in power consumption of the semiconductor integrated circuit for convenience. Thus, the number and shapes of regions obtained by dividing the semiconductor integrated circuit can be determined according to the granularity in spatial uniformization of power consumption as necessary.

Figure 2:
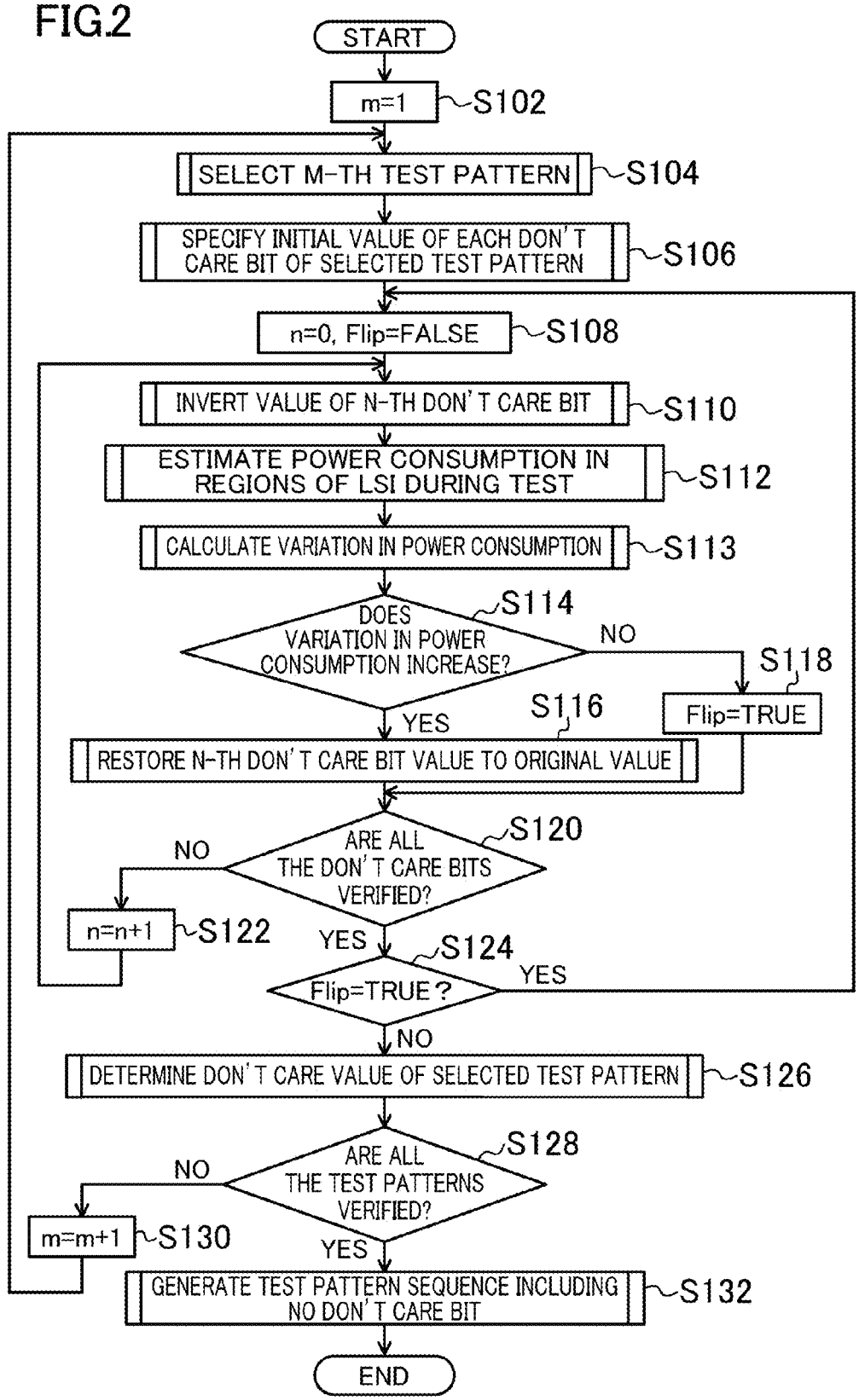
FIG. 2 illustrates a detailed flow chart of a determination of a don't care value of each test pattern.

FIG. 2 illustrates a detailed flow chart of a determination of a don't care value of each test pattern. First, m=1 is set (S102), and the m-th test pattern is selected from the test pattern sequence 10 (S104). Here, the selected test pattern is a test pattern including a don't care bit. The "m" is an index identifying a test pattern to be selected from the test pattern sequence 10. Then, an initial value is specified in each don't care bit of the test pattern selected at step S104 (S106). The initial value of each don't care bit is an arbitrary value, and is preferably a value employed in a low power consumption test for reducing power consumption of the semiconductor integrated circuit during the test.

Subsequently, n=0 and Flip=FALSE are set (S108). The "n" is an index identifying the bit position of a don't care bit of a test pattern. The "Flip" is a flag indicating whether a don't care value changes or not between before and after verification of all the don't care bits, as will be described later. After initial setting of "n" and "Flip," the value of the n-th don't care bit of the test pattern selected at step S104 is inverted (S110). Then, power consumption in regions of the semiconductor integrated circuit in a case where the test pattern having the don't care value after step S110 is applied to the semiconductor integrated circuit is estimated (S112). This estimation is performed in a simulation. In this simulation, power consumption in the regions is preferably estimated in consideration of not only scan-in of the current test pattern but also scan-out of the preceding test response.

After power consumption in regions of the semiconductor integrated circuit during the test has been estimated at step S112, a variation in power consumption among the regions is calculated, and temporarily stored (S113). This variation can use, as indexes, variance of a power consumption distribution and a difference between the maximum and minimum values of power consumption, for example. Then, the temporarily stored variation and the variation newly calculated at step S113 are compared (S114). If the latter is lager, i.e., a variation in power consumption among the regions of the semiconductor integrated circuit increases by inversion of the value of the n-th don't care bit (Yes at S114), the value of the n-th don't care bit is restored to the original value (S116). On the other hand, if the former is larger, i.e., a variation in power consumption among the regions of the semiconductor integrated circuit decreases by inversion of the value of the n-th don't care bit (No at S114), the temporarily stored variation is updated, and Flip=TRUE is set (S118).

When step S116 or S118 is finished, it is determined whether verification of all the don't care bits of the test pattern selected at step S104 is finished or not (S120). If an unverified don't care bit remains (No at S120), n is incremented (S122), and the process returns to step S110. On the other hand, if verification of all the don't care bits is finished (Yes at S120), the state of Flip is checked (S124).

If the don't care value changes between before and after verification of all the don't care bits of the test pattern selected at step S104, Flip=TRUE has been set. If Flip=TRUE (Yes at S124), the process returns to step S108, and verification of all the don't care bits in the test pattern selected at step S104 is performed again. In this manner, steps S108-S124 are repeated until the don't care value of the test pattern selected at step S104 does not change any more. Accordingly, a don't care value which minimizes a variation in power consumption among the regions of the semiconductor integrated circuit during the test can be heuristically obtained.

If the don't care value of the test pattern selected at step S104 does not change any more as a result of repetition of steps S108-S124, Flip=FALSE has been set at step S124. In this case (No at S124), the don't care value at the time when step S124 is finished is determined as a don't care value of the test pattern selected at step S104 (S126).

Thereafter, it is determined whether verification of all the test patterns of the test pattern sequence 10 is finished or not (S128). If an unverified test pattern remains (No at S128), m is incremented (S130), and the process returns to step S104. On the other hand, if verification of all the test patterns is finished (Yes at S128), a test pattern sequence 20 constituted by a plurality of test patterns including no don't care bit is generated, and the process ends (S132).

Estimation of power consumption in regions of the semiconductor integrated circuit at step S112 can be performed in simulations of logic, electric power, and temperature. However, if these simulations are performed for every change in the value of a don't care bit, it takes too much time, and is not practical. To avoid this, the following high-speed power consumption estimation can be performed.

In the high-speed power consumption estimation, power consumption in each region is estimated based on an FF average transition rate of each region and an FF average transition rate of its neighboring regions in a case where a test pattern sequence in which the value of a don't care bit is tentatively determined is applied to the semiconductor integrated circuit. The FF average transition rate refers to an average of transition rates of a plurality of scan flip-flops belonging to each region. For example, suppose a region includes four scan flip-flops and these four scan flip-flops hold "0000," scan-in of "1101" as a test pattern causes the value held by the four scan flip-flops to change "0000" →"1000"→"0100"→"1010"→"1101." Specifically, the value held by each of the four scan flip-flops changes three times, three times, twice, and once, respectively, in four clocks. Accordingly, the transition rates of the four scan flip-flops in this case are $3/4$, $3/4$, $2/4$, and $1/4$, respectively, and the FF average transition rate of this region is $9/16$, which is the average of the above transition rates. In this manner, the FF average transition rate of each region is uniquely obtained based on a test pattern sequence applied to the semiconductor integrated circuit.

Specifically, power consumption $P_i$ of a region i can be estimated at high speed based on the following equation:

$$P_i = (1+D(i,SA_{i,adj})) \times P_{base}(i,SA_i)$$

where $SA_i$ is an FF average transition rate of the region i, and $SA_{i,adj}$ is a relative value of the average value of FF average transition rates of regions neighboring the region i with respect to $SA_i$. For example, if $SA_i$ is 30% and the average value of the FF average transition rates of regions neighboring the region i is 50%, $SA_{i,adj}$ is 20%. On the other hand, if $SA_i$ is 30% and the average value of the FF average transition rates of regions neighboring the region i is 20%, $SA_{i,adj}$ is −10%. The number of the neighboring regions varies depending on the location of the region i. For example, suppose the layout region of the semiconductor integrated circuit is divided in matrix, a region i at a corner of the layout region of the semiconductor integrated circuit is surrounded by three neighboring regions, a region i in contact with a side of the layout region of the semiconductor integrated circuit is surrounded by five neighboring regions, and each of the other regions i is surrounded by eight neighboring regions.

In the above equation, $P_{base}(i, SA_i)$ is power consumption (i.e., reference power consumption) of a region i when the FF average transition rates of all the regions are $SA_i$. The reference power consumption can be calculated by using an existing pattern-independent static electric power analysis tool. When the FF average transition rate of the region i is input to this tool, the transition rates of the values of signal lines included in the region i are estimated, and power consumption of scan flip-flops and combinational circuits belonging to the region i is estimated.

Since it takes time to calculate reference power consumption with a tool at every time, some representative values may be prepared beforehand so that an intermediate value is calculated by linear interpolation of the representative values. Specifically, a technique in which the FF average transition rate is changed from 0% to 100% stepwise by 10% for each region, and representative values of reference power consumption are calculated and stored in, for example, a table, may be employed. With this technique, to estimate power consumption in each region, it is sufficient to read values from the table and perform linear interpolation as necessary. Accordingly, power consumption can be estimated at higher speed.

In the above equation, $1+D(i, SA_{i,adj})$ is a correction factor with respect to reference power consumption, and $D(i, SA_{i,adj})$ is a power consumption correction rate of a region i. If the power consumption correction rate is positive, $P_i$ is larger than $P_{base}(i, SA_i)$. If the power consumption correction rate is negative, $P_i$ is smaller than $P_{base}(i, SA_i)$. The $D(i, SA_{i,adj})$ can be defined by, for example, the following equation:

$$D(i,SA_{i,adj}) = (Pd(i,SA_{i,adj}) - Pd(i,0))/Pd(i,0)$$

where $Pd(i, SA_{i,adj})$ is power consumption (i.e., corrected power consumption) of a region i when the FF average transition rate of the region i is fixed at an arbitrary value SA and the relative value of the average values of the FF average transition rates of neighboring regions are $SA_{i,adj}$. The corrected power consumption can also be calculated by using an existing pattern-independent static electric power analysis tool.

Since it takes time to calculate corrected power consumption with a tool at every time, some representative values may be prepared beforehand so that an intermediate value is calculated by linear interpolation of the representative values. Specifically, a technique in which $SA_{i,adj}$ is changed from −30% to +70% stepwise by 10% with SA fixed at 30% for each region, and representative values of corrected power consumption are calculated and stored in, for example, a table, may be employed. With this technique, to estimate power consumption in each region, it is sufficient to read values from the table and perform linear interpolation as necessary. Accordingly, power consumption can be estimated at higher speed.

Next, advantages of the above test pattern generation method will be described. FIG. 3A illustrates a thermal simulation result in a case where a semiconductor integrated circuit was tested using a test pattern sequence generated by a general ATPG tool or the like. FIG. 3B illustrates a thermal simulation result in a case where a semiconductor integrated circuit was tested using the test pattern sequence 20 generated with the above-described test pattern generation method. In either case, the semiconductor integrated circuit is divided into 64 regions of 8×8 in rows and columns, and the temperature is represented by gray scales. A higher concentration, i.e., a darker color, represents a higher temperature.

As clearly shown in FIGS. 3A and 3B, in the case of using a conventional test pattern sequence, a spatial temperature variation of the semiconductor integrated circuit is large, whereas in the case of using the test pattern sequence 20 generated with the above-described test pattern generation method, a spatial temperature variation of the semiconductor integrated circuit is small. That is, the use of the test pattern sequence 20 spatially uniformizes the temperature of the semiconductor integrated circuit during the test. In this manner, a don't care value of each test patter is determined in consideration of spatial uniformization of power consumption of the semiconductor integrated circuit during the test, thereby obtaining a test pattern sequence which can achieve spatial uniformization of temperature of the semiconductor integrated circuit during the test.

<Temporal Temperature Uniformization>

Once the test pattern sequence 20 which can achieve a spatial uniformization of temperature is obtained, then the test pattern sequence 20 is preferably modified so as to achieve temporal uniformization of temperature. An example of a test pattern generation method for temporally uniformizing the temperature will be described hereinafter.

Referring again to FIG. 1, after determination of the don't care value at step S1, a temperature change in the semiconductor integrated circuit in a case where each test pattern in the test pattern sequence 20 is applied to the semiconductor integrated circuit is estimated, and the order of application of test patterns is changed such that a temporal temperature variation in the semiconductor integrated circuit during the test is reduced, thereby generating a test pattern sequence 30 (S2). Specifically, at this time, the order of application of test patterns is changed such that the temperature of the semiconductor integrated circuit during the test is temporally uniformized.

FIG. 4 illustrates a detailed flow chart of a change of the order of applying test patterns. First, the average value of power consumption of the semiconductor integrated circuit in a case where test patterns in the test pattern sequence 20 are sequentially applied is estimated (S202). Then, based on the estimated average value, the average temperature of the semiconductor integrated circuit in a case where the test pattern sequence 20 is applied is estimated (S204).

The average temperature can be estimated as a convergence temperature of the semiconductor integrated circuit in a case where power consumption of the semiconductor integrated circuit during the test is constant at the average value. It is easy to predict the convergence temperature of the semiconductor integrated circuit when power consumption is constant. As power consumption of the semiconductor integrated circuit for each test pattern, the average value of power consumption in regions, i.e., spatially average power consumption of the semiconductor integrated circuit is employed. If the average value of power consumption is also calculated at the same time with calculation of a variation in power consumption among the regions of the semiconductor integrated circuit in uniformizing the spatial temperature as described above, it is unnecessary to estimate the average value of power consumption again at this process.

Next, a pattern sequence for setting the temperature of the semiconductor integrated circuit at the start of the test at the estimated average temperature is obtained (S206). Since the temperature of the semiconductor integrated circuit at the start of the test varies depending on differences in test environments, the temperature of the semiconductor integrated circuit is set at the estimated average temperature before application of a test pattern sequence.

A pattern sequence for setting the temperature of the semiconductor integrated circuit at the estimated average temperature is not a pattern sequence for a test on the semiconductor integrated circuit. Thus, it is preferable to prepare a pattern sequence including a pattern which satisfies spatial uniformity of power consumption and causes an abrupt change in the temperature of the semiconductor integrated circuit. In executing a test, the temperature of the semiconductor integrated circuit can be set at the estimated average temperature by adjusting an input sequence length in the pattern sequence to be applied to the semiconductor integrated circuit according to the temperature of the semiconductor integrated circuit measured with, for example, a temperature sensor. To quickly set the temperature of the semiconductor integrated circuit at the estimated average temperature, the clock frequency may be raised to increase power consumption.

The pattern sequence for setting the temperature of the semiconductor integrated circuit at the estimated average temperature does not need to be obtained before a test pattern sequence is divided into subsequences as described below. This pattern sequence is used for increasing the temperature of the semiconductor integrated circuit to the estimated average temperature before the test pattern sequence 30 is actually applied to the semiconductor integrated circuit, and thus, only needs to be generated at any time before the start of an actual test, independently of the test pattern generation method of this embodiment.

Then, a temperature simulation is performed, and the test pattern sequence 20 is divided into a plurality of subsequences (S208). Each of the subsequences is part of the test pattern sequence 20, and is constituted by one or more test patterns. Specifically, each of the subsequences is a group of one or more test patterns in which in a case where a test on the semiconductor integrated circuit is started with the temperature of the semiconductor integrated circuit set at the estimated average temperature, the temperature of the semiconductor integrated circuit at the end of the test is within a predetermined relative temperature range with reference to the estimated average temperature, i.e., reaches the upper limit temperature or the lower limit temperature. The upper limit and the lower limit of the temperature range can be set at any range (e.g., ±3° C.) by a user.

Figure 5:
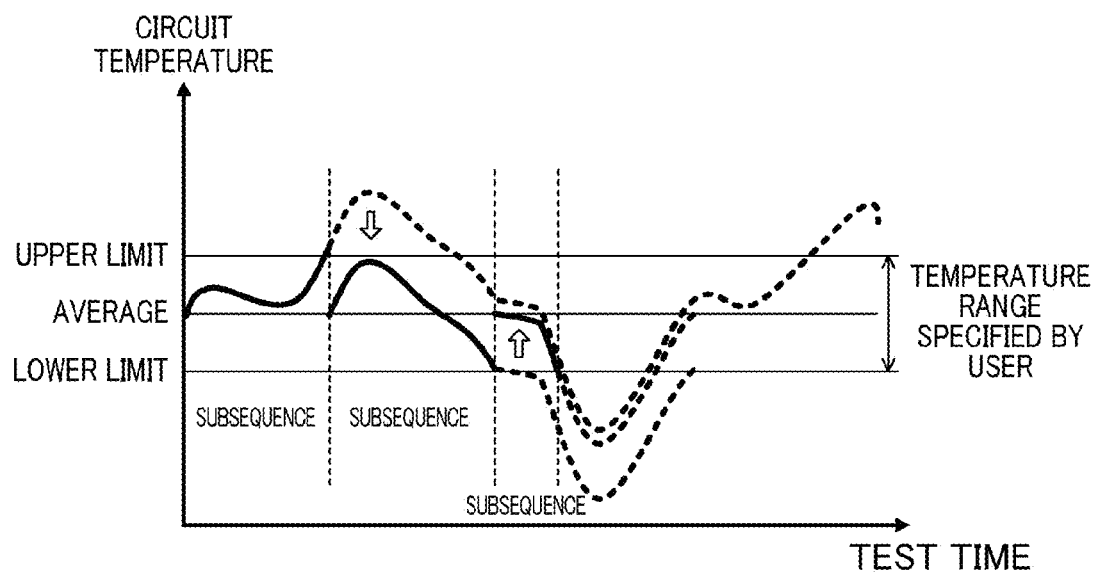
FIG. 5 schematically illustrates a division of a test pattern sequence.

Referring now to FIG. 5, a specific method for dividing the test pattern sequence 20 will be described. In FIG. 5, the abscissa represents a test time, and the ordinate represents the temperature of the semiconductor integrated circuit. The solid lines represent changes in the temperature of the semiconductor integrated circuit by application of subsequences, and the broken lines represent changes in the temperature of the semiconductor integrated circuit in a case where the test continues without separation of the test pattern sequence 20. In a case where a test on the semiconductor integrated circuit is started with the temperature of the semiconductor integrated circuit set at the estimated average temperature and test patterns are applied in the order defined by the test pattern sequence 20, when the temperature of the semiconductor integrated circuit exceeds a specified range, the test pattern sequence 20 is separated, and sequences which has been applied at this point of time are defined as subsequences. Then, the subsequences are deleted from the test pattern sequence 20, and the this process is repeated until the test pattern sequence 20 becomes empty.

Referring again to FIG. 4, when the division into the subsequences is finished, the order of application of subsequences is changed such that a temporal temperature variation in the semiconductor integrated circuit during the test is reduced, and a test pattern sequence 30 is generated (S210). Basically, the temporal temperature variation in the semiconductor integrated circuit during the test can be reduced by rearranging the subsequences such that subsequences which increase the temperature of the semiconductor integrated circuit and subsequences which reduce the temperature of the semiconductor integrated circuit are alternately applied. Specifically, the use of the test pattern sequence 30 can spatially and temporally uniformize a temperature variation in the semiconductor integrated circuit during the test.

Figure 6:
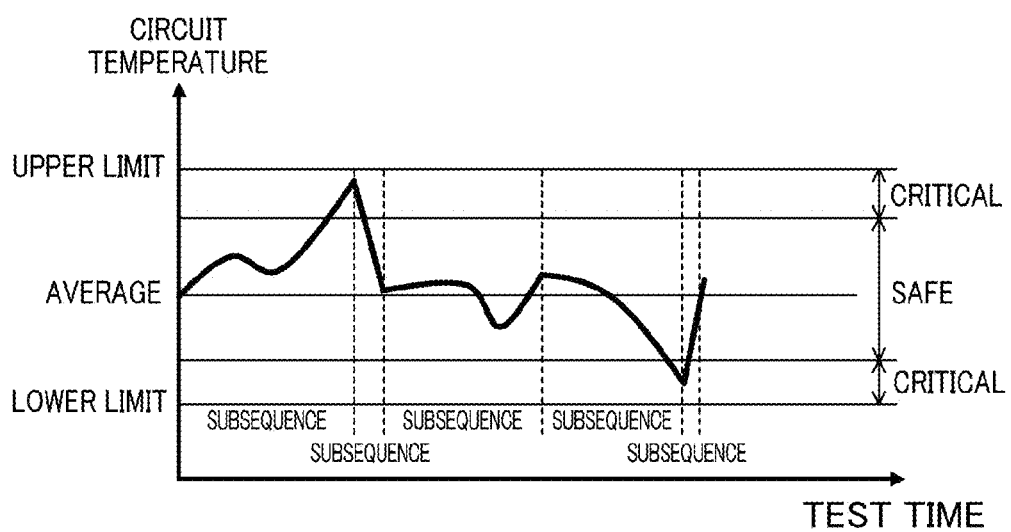
FIG. 6 schematically illustrates a rearrangement of subsequences.

The rearrangement of the subsequences is preferably performed in consideration of the temperature rise rate and temperature fall rate of the semiconductor integrated circuit by application of subsequences. An example of the rearrangement of subsequences will be described with reference to FIG. 6.

First, the temperature of the semiconductor integrated circuit when a test on a subsequence is finished after a test on the semiconductor integrated circuit has been started with the temperature of the semiconductor integrated circuit set at the estimated average temperature, is estimated. Then, the method for selecting a subsequence to be applied next is changed depending on whether the above temperature is in a critical region where the temperature is close to the upper-limit or lower-limit temperature or in a safe region where the temperature is sufficiently away from the upper-limit and lower-limit temperatures.

Specifically, if the temperature is in the critical region, one of the remaining subsequences including the smallest number of test patterns, i.e., a subsequence which can return the temperature of the semiconductor integrated circuit to a temperature near the estimated average temperature in the shortest time, is selected. On the other hand, if the temperature is in the safe region, one of the remaining subsequences including the largest number of test patterns is selected. This is because of the purpose of maintaining the order of application of test patterns of the test pattern sequence 20 optimized so as to minimize a change in the values of scan flip-flops between scan-in of a test pattern and scan-out of the preceding test response in consideration of power consumption of the semiconductor integrated circuit according to test response. To reduce the temperature of the semiconductor integrated circuit in the critical region, a clock signal may be stopped or a dummy pattern which rapidly reduces the temperature may be applied.

As described above, in this embodiment, a test pattern which can spatially and temporally uniformize power consumption of a semiconductor integrated circuit during a test can be generated. The use of such a test pattern can accurately detect a minute circuit delay in each of a manufacturing test and a field test. In general, a frequency operating margin of several percentages to about ten percentages is set in the semiconductor integrated circuit as a measure for test accuracy and a measure against degradation over time. Accurate detection of a delay fault in the manufacturing test can reduce the operating margin to enhance the yield. In addition, accurate detection of a delay fault in the field test by incorporating a built-in self test (BIST) in the semiconductor integrated circuit can predict degradation over time of the semiconductor integrated circuit before occurrence of the degradation.

If spatial temperature uniformization is not needed because a test pattern sequence which can achieve spatial uniformization of temperature, the scale of the semiconductor integrated circuit is small, or other reasons, the process for spatially uniformizing the temperature may be omitted so that only the process for temporally uniformizing the temperature is performed.

Other implementations are contemplated.

What is claimed is:

1. A test pattern generation method for a semiconductor integrated circuit subjected to scan design, the method comprising:
    sequentially selecting, by using a computer, a test pattern from an original test pattern sequence constituted by a plurality of test patterns including a don't care bit;
    estimating power consumption in each of regions obtained by substantially equally dividing a layout region of the semiconductor integrated circuit in a case where a don't care value is specified in the selected test pattern and this selected test pattern is applied to the semiconductor integrated circuit;
    searching for a don't care value of the selected test pattern which minimizes a variation in power consumption among the regions by repeatedly changing the don't care value and repeatedly estimating power consumption in the regions; and
    generating a first new test pattern sequence constituted by a plurality of test patterns including no don't care bit by defining the don't care value obtained by the searching as a don't care value of the selected test pattern.

2. The test pattern generation method of claim 1, wherein the searching the don't care value includes:
    specifying an initial value in each don't care bit of the selected test pattern;
    sequentially selecting a don't care bit from the selected test pattern;
    inverting a value of the selected don't care bit;
    calculating a variation in power consumption among the regions by estimating power consumption in each of the regions every time the value of the don't care bit is inverted;
    restoring the inverted value of the don't care bit if a variation in power consumption among the regions increases by the inversion of the value of the don't care bit; and
    performing a process from the sequentially selecting the don't care bits again on the selected test pattern if the don't care value of the selected test pattern changes between before and after verification of all don't care bits of the selected test pattern.

3. The test pattern generation method of claim 1, wherein the estimating power consumption includes:
    estimating, for each of the regions, an FF average transition rate which is an average of transition rates of values held by a plurality of scan flip-flops belonging to the region in a case where the test pattern in which the don't care value is specified is applied to the semiconductor integrated circuit, based on the test pattern in which the don't care value is specified;
    estimating, for each of the regions, a relative value of an average value of FF average transition rates of neighboring regions to an FF average transition rate of the region, based on the test pattern in which the don't care value is specified; and
    estimating, for each of the regions, power consumption in the region by multiplying reference power consumption determined from an FF average transition rate of the region by a correction factor determined from the relative value.

4. The test pattern generation method of claim 1, further comprising:
generating a second new test pattern sequence by estimating a change in temperature of the semiconductor integrated circuit in a case where the test patterns included in the first new test pattern sequence are sequentially applied to the semiconductor integrated circuit, and by rearranging an order of applying the test patterns included in the first new test pattern sequence such that a temporal temperature variation of the semiconductor integrated circuit during a test is reduced.

5. The test pattern generation method of claim 4, wherein the generating the second new test pattern sequence includes:
estimating an average value of power consumption of the semiconductor integrated circuit in a case where test patterns included in the first new test pattern sequence are sequentially applied to the semiconductor integrated circuit;
estimating an average temperature of the semiconductor integrated circuit in a case where the first new test pattern sequence is applied to the semiconductor integrated circuit, based on the estimated average value of power consumption of the semiconductor integrated circuit;
dividing the first new test pattern sequence into a plurality of subsequences each constituted by one or more test patterns such that a temperature of the semiconductor integrated circuit is within a range of a predetermined relative temperature with reference to the estimated average temperature in a case where a test on the semiconductor integrated circuit is started with the temperature of the semiconductor integrated circuit set at the estimated average temperature; and
rearranging the subsequences such that a temporal temperature variation of the semiconductor integrated circuit during the test is reduced.

6. The test pattern generation method of claim 5, wherein the rearranging the subsequences includes:
estimating a temperature of the semiconductor integrated circuit in a case where application of an n-th subsequence is finished after the test on the semiconductor integrated circuit has been started with the temperature of the semiconductor integrated circuit set at the estimated average temperature; and
selecting, as an (n+1)-th subsequence, one of the remaining subsequences including a smallest number of test patterns if the estimated temperature is near the predetermined relative temperature, and otherwise one of the remaining subsequences including a largest number of test patterns.

7. A non-transitory computer-readable medium on which a computer program for generating test patterns of a semiconductor integrated circuit subjected to scan design is recorded, the medium comprising:
a first source code portion sequentially selecting a test pattern from an original test pattern sequence including a plurality of test patterns including a don't care bit;
a second source code portion estimating power consumption in each of regions obtained by substantially equally dividing a layout region of the semiconductor integrated circuit in a case where a don't care value is specified in the selected test pattern and this selected test pattern is applied to the semiconductor integrated circuit;
a third source code portion searching for a don't care value of the selected test pattern which minimizes a variation in power consumption among the regions by repeatedly changing don't care values and repeatedly estimating power consumption on the regions; and
a fourth source code portion generating a first new test pattern sequence constituted by a plurality of test patterns including no don't care bit by defining the don't care value obtained by the searching as a don't care value of the selected test pattern.

8. The non-transitory computer-readable medium of claim 7, further comprising:
a fifth source code portion generating a second new test pattern sequence by estimating a change in temperature of the semiconductor integrated circuit in a case where the test patterns included in the first new test pattern sequence are sequentially applied to the semiconductor integrated circuit, and by rearranging an order of applying the test patterns included in the first new test pattern sequence such that a temporal temperature variation of the semiconductor integrated circuit during a test is reduced.

* * * * *